United States Patent
Ha et al.

(10) Patent No.: US 12,266,742 B2
(45) Date of Patent: Apr. 1, 2025

(54) SEMICONDUCTOR LIGHT EMITTING DEVICE AND SEMICONDUCTOR LIGHT EMITTING DEVICE ARRAY

(71) Applicant: SAMSUNG ELECTRONICS CO., LTD., Suwon-si (KR)

(72) Inventors: Myoungsun Ha, Suwon-si (KR); Hyunju Park, Hwaseong-si (KR); Sunwoo Kim, Hwaseong-si (KR); Youngkyung Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 17/724,758

(22) Filed: Apr. 20, 2022

(65) Prior Publication Data

US 2022/0416130 A1 Dec. 29, 2022

(30) Foreign Application Priority Data

Jun. 23, 2021 (KR) .................. 10-2021-0081340

(51) Int. Cl.
*H01L 33/48* (2010.01)
*H01L 25/075* (2006.01)
*H01L 33/50* (2010.01)
*H01L 33/62* (2010.01)

(52) U.S. Cl.
CPC ........ *H01L 33/486* (2013.01); *H01L 25/0753* (2013.01); *H01L 33/502* (2013.01); *H01L 33/62* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| KR | 10-2019-0117316 A | 10/2019 |
| KR | 10-2019-0135196 A | 12/2019 |

*Primary Examiner* — Asok K Sarkar
(74) *Attorney, Agent, or Firm* — Muir Patent Law, PLLC

(57) ABSTRACT

A semiconductor light emitting device includes a package body including a concave portion surrounded by sidewalls, a light emitting diode (LED) chip on a mounting surface of the concave portion, a lead frame in the package body and electrically connected to the LED chip, a wavelength conversion layer in the concave portion and surrounding the LED chip, the wavelength conversion layer being surrounded by the sidewalls of the package body and including a wavelength conversion material, and a transparent resin layer on the wavelength conversion layer, the transparent resin layer having first opposite side surfaces exposed through sides of the package body and spaced apart from each other along a first direction parallel to the mounting surface, and second opposite side surfaces contacting an inner surface of the package body and spaced apart from each other in a second direction parallel to the mounting surface.

20 Claims, 18 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,491,977 B2 | 2/2009 | Fukasawa |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,270,021 B2 | 4/2019 | Lee et al. |
| 10,693,049 B2 | 6/2020 | Moon et al. |
| 10,957,676 B2 | 3/2021 | Kobayakawa et al. |
| 2008/0054279 A1* | 3/2008 | Hussell ............... H01L 33/54 |
| | | 257/E33.059 |
| 2010/0134716 A1 | 6/2010 | Hamada |
| 2013/0001599 A1* | 1/2013 | Lee ..................... H01L 33/647 |
| | | 257/E27.12 |
| 2013/0049023 A1* | 2/2013 | Kim ..................... H01L 33/60 |
| | | 257/E33.072 |
| 2017/0040301 A1* | 2/2017 | Yamamoto ............ H01L 33/62 |

* cited by examiner

SEMICONDUCTOR LIGHT EMITTING DEVICE AND SEMICONDUCTOR LIGHT EMITTING DEVICE ARRAY

CROSS-REFERENCE TO RELATED APPLICATION

This application claims benefit of priority to Korean Patent Application No. 10-2021-0081340, filed on Jun. 23, 2021, in the Korean Intellectual Property Office, the disclosure of which is incorporated herein by reference in its entirety.

BACKGROUND

1. Field

Embodiments relate to a semiconductor light emitting device and a light emitting device array.

2. Description of the Related Art

A light emitting diode (LED) refers to a semiconductor device capable of realizing light of various colors using a PN junction of a compound semiconductor. LEDs have a long lifespan, can be miniaturized and lightweight, and have strong light directivity, as well as being able to be driven at a low voltage. In addition, the LED is resistant to impacts and vibrations, does not require a preheating time and complicated driving, and can be packaged in various forms, so it can be applied for various purposes. The semiconductor light emitting device may undergo a primary packaging process in which a phosphor, a lens, and the like are mounted on a frame, and a secondary packaging process in which a plurality of semiconductor light emitting devices made in this manner are mounted on a circuit board together with other devices.

SUMMARY

According to an aspect of embodiments, a semiconductor light emitting device, may include a package body including a concave portion, the concave portion being surrounded by sidewalls of the package body; at least one light emitting diode (LED) chip on a mounting surface of the concave portion; a lead frame in the package body, the lead frame being electrically connected to the at least one LED chip; a wavelength conversion layer in the concave portion and surrounding the at least one LED chip, the wavelength conversion layer being surrounded by the sidewalls of the package body and including a wavelength conversion material; and a transparent resin layer on the wavelength conversion layer to seal the wavelength conversion layer, the transparent resin layer having: first opposite side surfaces exposed through sides of the package body, the first opposite side surfaces being spaced apart from each other along a first direction parallel to the mounting surface, and second opposite side surfaces in contact with an inner surface of the package body, the second opposite side surfaces being spaced apart from each other in a second direction parallel to the mounting surface.

According to an aspect of embodiments, a semiconductor light emitting device may include a package body including a concave portion, the concave portion being surrounded by sidewalls of the package body, and the concave portion including a first concave portion and a second concave portion, divided by a partition wall and disposed side by side in a long axial direction; a first light emitting diode (LED) chip on a mounting surface of the first concave portion; a second LED chip on a mounting surface of the second concave portion; a lead frame in the package body, the lead frame being electrically connected to the first LED chip and the second LED chip; a wavelength conversion layer in the first concave portion and surrounding the first LED chip, the wavelength conversion layer including a wavelength conversion material; a transparent resin layer in the second concave portion and surrounding the second LED chip; a first upper layer on the wavelength conversion layer, the first upper layer having first opposite side surfaces spaced apart from each other in the long axial direction of the package body, and one surface of the first opposite side surfaces being exposed through the package body; and a second upper layer on the transparent resin layer, the second upper layer having second opposite side surfaces spaced apart from each other in the long axial direction of the package body, and one surface of the second opposite side surfaces being exposed through the package body, wherein the first upper layer and the second upper layer being in contact with a side surface of the package body in a short axial direction of the package body.

According to an aspect of embodiments, a semiconductor light emitting device array, may include an array body including a package body with concave portions arranged side by side in a first direction, each of the concave portions being surrounded by a sidewall; a light emitting diode (LED) chip on a mounting surface in each of the concave portions, a lead frame being electrically connected to the LED chip; a wavelength conversion layer in each of the concave portions and surrounding the LED chip, the wavelength conversion layer including a wavelength conversion material that is a precipitant of a resin applied to an upper surface of the LED chip; and a transparent resin layer on the wavelength conversion layer to seal the wavelength conversion layer, the transparent resin layer extending in the first direction, and including a remaining portion of the resin.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
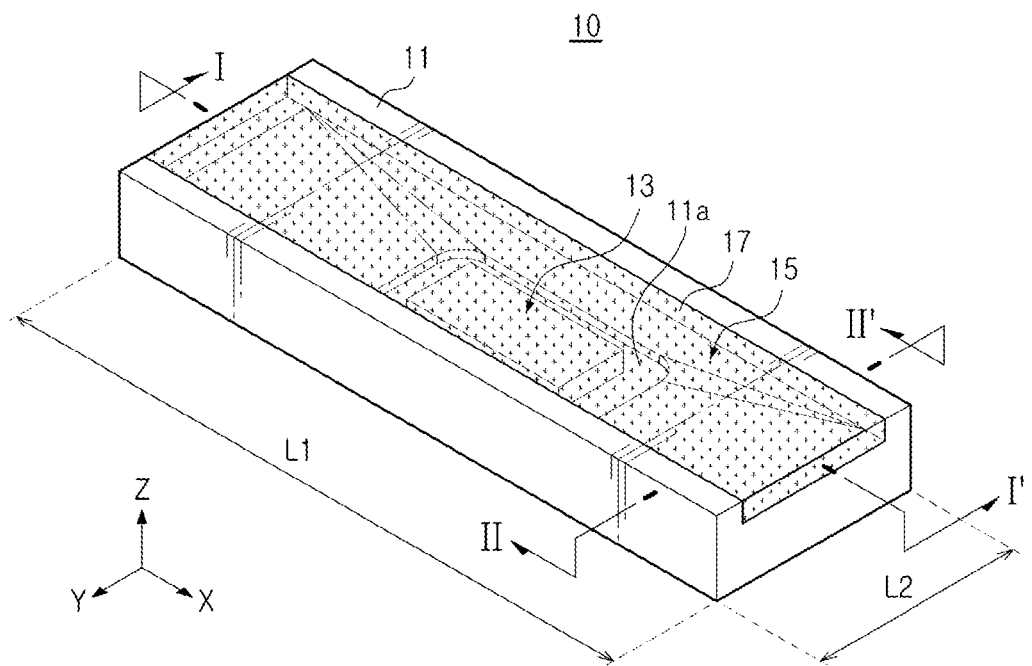
FIG. 1 is a perspective view illustrating a semiconductor light emitting device according to an example embodiment.
Figure 2:
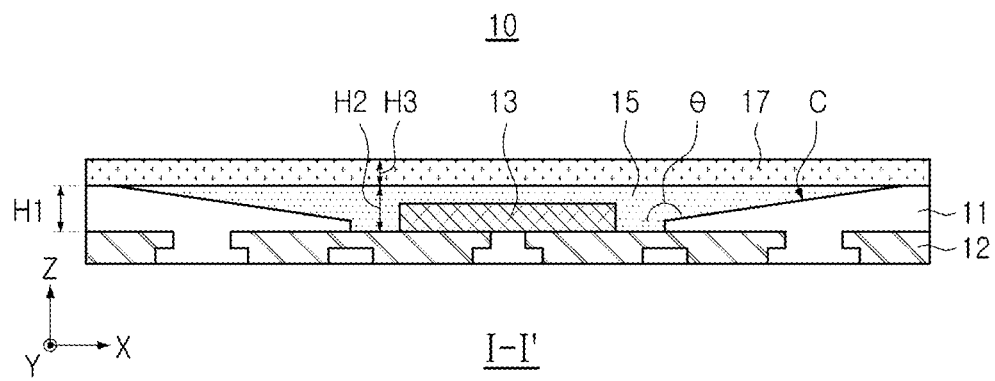
FIGS. 2 and 3 are cross-sectional views illustrating a semiconductor light emitting device according to an example embodiment.
Figure 3:
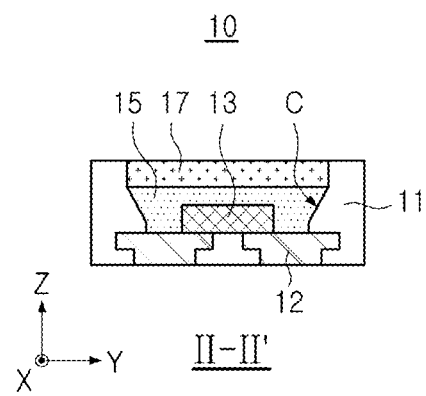

FIG. 1 is a perspective view of a semiconductor light emitting device according to an example embodiment. FIGS. 2 and 3 are cross-sectional views illustrating a semiconductor light emitting device according to an example embodiment. That is, FIG. 2 is a cross-sectional view along line I-I' of FIG. 1 (in a long axial direction), and FIG. 3 is a cross-sectional view along line II-II' of FIG. 1 (in a short axial direction).

Referring to FIGS. 1 to 3, a semiconductor light emitting device 10 may include an upper surface perpendicular to a first direction (e.g., a Z direction). In the semiconductor light emitting device 10 illustrated in FIGS. 1 to 3, a long axial direction may be a second direction (e.g., an X direction), and a short axial direction may be a third direction (e.g., a Y direction). For example, a length of the semiconductor light emitting device 10 in the second direction, which is the long axis, may be a first length L1, and a length of the semiconductor light emitting device 10 in the third direction, which is the short axis, may be a second length L2, which is smaller than the first length L1.

As illustrated in FIGS. 1 to 3, the semiconductor light emitting device 10 may include a package body 11, a lead frame 12, at least one light emitting diode (LED) chip 13, a first layer 15, and a second layer 17.

The package body 11 may be a support in which the lead frame 12 is installed and the LED chip 13 electrically connected to the lead frame 12 is mounted. For example, the package body 11 may be formed using a polymer-based resin that is easily deformed at a high temperature, e.g., polyphthalamide (PPA), liquid crystal polymer (LCP), or the like.

In the semiconductor light emitting device 10 according to an example embodiment, the package body 11 may include a concave portion C defined by a sidewall. For example, the concave portion C may be surrounded by a sidewall including an inclination having a predetermined angle.

For example, as illustrated in FIG. 1, the concave portion C may be an opening, e.g., a cavity, within the package body 11 that extends from a topmost surface of the package body 11 to a predetermined depth, such that a perimeter of the concave portion C may be surrounded by inner sidewalls of the package body 11. For example, as illustrated in FIGS. 1-3, the inner sidewalls of the package body 11 that surround the concave portion C, i.e., the inner sidewalls that define the concave portion C, may be inclined at an oblique angle with respect to a bottom surface of the package body 11. For example, as illustrated in FIG. 1, a length of the concave portion C in the second direction, e.g., in the X axis, may be longer than a length of the concave portion C in the third direction, e.g., in the Y axis, and the inclination angles of the inner sidewalls in the second direction, e.g., in the X axis (FIG. 2), may be larger than the inclination angle of the inner sidewalls in the third direction, e.g., in the Y axis (FIG. 3). For example, referring to FIGS. 1-3, a bottom of the concave portion C may be flat and may include a mounting surface 11a.

In detail, referring to FIGS. 1 to 3, the concave portion C is illustrated in a shape of a rectangle corresponding to the LED chip 13 in the first direction, e.g., the Z direction, and in a straight inclined surface having a constant inclination in the second and third directions, e.g., the X and Y directions. For example, as illustrated in FIG. 2, the concave portion C may have inclined surfaces that define an opening in the package body 11 with an inverted trapezoidal cross-section, e.g., so the smaller base of the trapezoidal cross-section exposes and overlaps the LED chip 13. However, this is merely an example, e.g., the concave portion C may be circular, elliptical, or polygonal in the first direction. In another example, the concave portion C may have a curved inclined surface whose inclination is changed in the second direction and the third direction. In yet another example, the concave portion C may include an inclined surface in the second direction, which is a long-axial direction, and may not include the inclined surface, in the third direction, which is a short-axial direction.

The lead frame 12 may be exposed to the concave portion C of the package body 11 to electrically connect a printed circuit board to the LED chip 13, e.g., the trapezoidal cross-section of the opening may expose a portion of the lead frame 12. For example, the lead frame 12 may be made of a copper (Cu) alloy, and may be formed in the shape shown in FIGS. 2 and 3 through press working, etching, and the like. However, this is merely an example, e.g., the shape of the lead frame 12 may be designed in various ways depending on an example embodiment and may be connected to the LED chip 13 through a separate wire. In this case, the wire may be made of gold (Au).

The LED chip 13 is a device having two electrodes, and may be a light source using an optical semiconductor converting electrical energy into light energy. The LED chip 13 included in the semiconductor light emitting device 10 according to an example embodiment may be disposed in the concave portion C, e.g., on the mounting surface 11a of the concave portion C, to emit light having a color, e.g., red color, green color, blue color, or the like, depending on the optical semiconductor included therein.

Light of various colors emitted from the LED chip 13 may be absorbed by a phosphor and converted into light of a different wavelength. For example, the phosphor may absorb light emitted from the LED chip 13 to emit white light. In the semiconductor light emitting device 10 according to an example embodiment, a first layer 15 may be disposed on the concave portion C and surround the LED chip 13, e.g., the first layer 15 may at least partially fill the concave portion C in the package body 11 with the trapezoidal cross-section to completely cover exposed surfaces of the LED chip 13. The first layer 15 may be surrounded, e.g., around an entire perimeter thereof, by a side surface, e.g., inner sidewalls, of the package body 11 in a direction parallel to the mounting surface in the concave portion C. For example, the first layer 15 may be a wavelength conversion layer having a phosphor corresponding to a wavelength conversion material. The first layer 15 may also serve to protect the LED chip 13.

A minimum thickness of the package body 11 in the third direction, i.e., a minimum distance in the Y direction between a side surface of the first layer 15 and an outer surface of the package body 11 may be about 20% or more of a thickness of the LED chip 13 in the Y direction. Meanwhile, a minimum thickness of the package body 11 in a second direction, i.e., a minimum distance in the X direction, between a side surface of the first layer 15 and an outer surface of the package body 11 may be between about 10 μm to 300 μm (e.g., about 100 μm).

In the semiconductor light emitting device 10 according to an example embodiment, the phosphor included in the first layer 15 may be a KSF phosphor including $K_xSiF_y$:$Mn^{4+}$ ($2 \leq x \leq 3$, $4 \leq y \leq 7$). For example, an average particle size of the KSF phosphor may be between about 10 μm and 40 μm, e.g., between about 15 μm and 30 μm, based on a median value. Meanwhile, a mass of the KSF phosphor included in the first layer 15 may be about 10% to 20%, e.g., about 11% to 14%, of a total mass of the first layer 15.

For example, the KSF phosphor may be relatively economical compared to other phosphors, but may be less reliable when exposed to an external environment having a high temperature and/or high humidity. For example, exposure of the KSF phosphor to high temperature and/or high humidity may deteriorate the performance of the semiconductor light emitting device 10. In the present specification, unless otherwise defined, the phosphor included in the semiconductor light emitting device according to the example embodiments may be a KSF phosphor.

The semiconductor light emitting device 10 according to an example embodiment may include a second layer 17 as a barrier for protecting the first layer 15 including a KSF phosphor from an external environment. The second layer 17 may be disposed on the first layer 15 such that the first layer 15 is not exposed. For example, referring to FIGS. 1-3, the second layer 17 may completely cover, e.g., overlap, an upper surface of the first layer 15, e.g., the second layer 17 may completely cover a surface of the first layer 15 that faces away from the lead frame 12. Accordingly, the first layer 15 may be, e.g., completely, separated from the external environment by the second layer 17 and sealed. For example, referring to FIGS. 1-3, the first layer 15 may be completely enclosed by the second layer 17, the inner sidewalls of the package body 11, the lead frame 12, and the LED chip 13.

The second layer 17 of the semiconductor light emitting device 10 illustrated in FIG. 2 is illustrated as having a flat upper surface, but this is merely an example and is not limited thereto. For example, the second layer 17 may have a concave shape with a low center, and may have a height difference of about 10 μm to 80 μm in the first direction from a central portion of the package.

In the semiconductor light emitting device 10 according to an example embodiment, the second layer 17 may be a transparent resin layer including silicone. However, this is merely an example and the present disclosure is not limited thereto, e.g., the second layer 17 may further include at least one of a phosphor and a dispersant together with silicone. Light emitted from the LED chip 13 may pass through the first layer 15 and the second layer 17 to be radiated externally.

Referring to FIG. 2, the concave portion C included in the package body 11 may have a first height H1 in the first direction. The first layer 15 formed inside the concave portion C may have a second height H2 that is less than or equal to the first height H1 at an outer boundary portion of the concave portion C. In FIGS. 2 and 3, the first height H1 and the second height H2 are illustrated as being the same, but this is merely an example. For example, the first layer 15 may have a second height H2 to be sealed without being directly exposed externally.

In the semiconductor light emitting device 10 according to an example embodiment, the second layer 17 disposed on an upper surface of the first layer 15 may have a third height H3. The third height H3 may be different from each of the first height H1 and the second height H2. The first height H1, the second height H2, and the third height H3 may vary depending on a scale of the semiconductor light emitting device 10. For example, the second height H2 and the third height H3 may vary within a range in which the third height H3 is a value between about 30% and 70% of a sum of heights of the second height H2 and the third height H3, e.g., the third height H3 may constitute about 30% to about 70% of a combined thickness of the second and third heights H2 and H3 in the first direction. Accordingly, the first height H1, greater than or equal to the second height H2, may also vary. For example, each of the first height H1, the second height H2, and the third height H3 may have a value between about 170 μm and 330 μm, respectively. However, this is merely an example and the present disclosure is not limited thereto, e.g., each of the first height H1, the second height H2, and the third height H3 may be 170 μm or less or 330 μm or more. For example, in the semiconductor light emitting device 10 according to an example embodiment, the third height H3 may be about 20% or more of the thickness of the LED chip 13 in the first direction.

Referring to FIGS. 1 and 2, the second layer 17 may be disposed, e.g., continuously, on an upper surface of the package body 11 in the second direction. In addition, referring to FIGS. 1 and 3, the second layer 17 may be disposed on a side surface of the package body 11 in the third direction, e.g., the second layer 17 may have opposite edges in the third direction in direct contact with inner side surfaces of the package body 11 that face each other in the third direction. Accordingly, light emitted from the LED chip 13 may be radiated to the second layer 17 through the upper surface of the first layer 15, and may be radiated externally through the upper surface and two side surfaces of the second layer 17 in the second direction.

In the semiconductor light emitting device 10 according to an example embodiment, a structure of the second layer 17 and a structure of the concave portion C may serve to improve a radiation efficiency of light emitted from the LED chip 13 externally. For example, the second layer 17 may be opened from an upper surface in the first direction and a side surface in the second direction to radiate light externally through three surfaces. For example, as illustrated in FIG. 1, the second layer 17 may be coplanar with the topmost surface of the package body 11 in plane XY, e.g., as viewed from the first direction, and may have opposite edges thereof in the second direction exposed to be coplanar with a side, e.g., lateral, surface of the package body 11 in plane YZ, e.g., as viewed in the second direction. As such, three surfaces of the second layer 17, i.e., a top surface and two lateral surfaces, may be exposed to the exterior.

In addition, in the semiconductor light emitting device 10 according to an example embodiment, the concave portion C may reflect the light emitted from the LED chip 13 to a reflective surface so that the light is radiated externally within a predetermined angle range. For example, the angle at which the light is radiated externally may be between about 120° and 140°, e.g., between 128° and 134°.

That is, the second layer 17 may have side surfaces that are open from both side surfaces of the package body 11 located in the second direction parallel to a mounting surface of the concave portion C among side surfaces of the package body 11. In addition, the second layer 17 may be disposed on the side surface of the package body 11 in a third direction, parallel to the mounting surface.

Referring to FIG. 2, a sidewall of the concave portion C in the second direction may have an angle θ between about 1200 and 170° with an upper surface of the LED chip 13. For example, in the second direction, the sidewall of the concave portion C may have an obtuse angle θ that is larger than 900 and smaller than 180° with respect to the upper surface of the LED chip 13, e.g., with respect to the upper surface of the lead frame 12.

For example, a lens may be disposed on the concave portion C in which the LED chip 13 is mounted. In this case, the lens may function to refract the light emitted from the LED chip 13 to appropriately control a radiation degree of light. For example, the lens may be formed of a transparent resin or glass, and may be directly formed on the concave portion C, or may be separately formed and then attached thereto.

Figure 4:
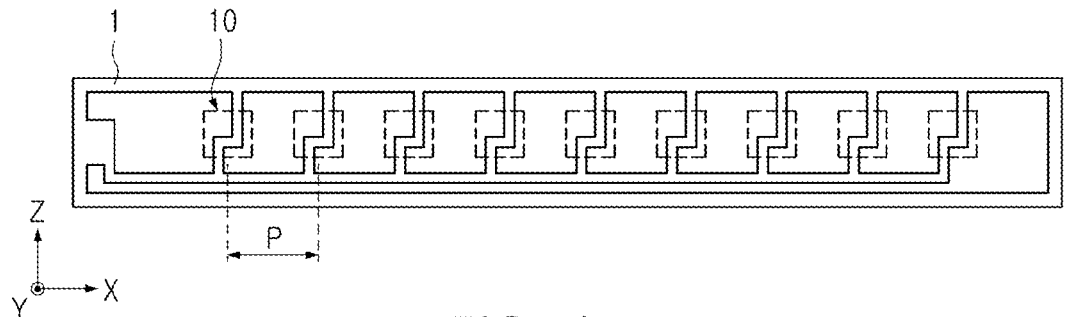
FIGS. 4 and 5 are views illustrating an effect of a semiconductor light emitting device according to an example embodiment.
Figure 5:
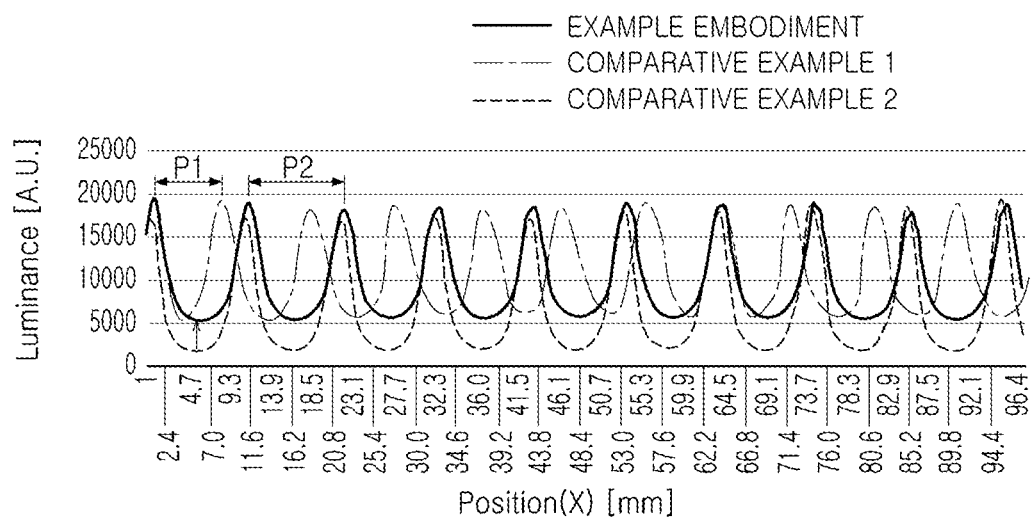

FIGS. 4 and 5 are views illustrating an effect of a semiconductor light emitting device according to an example embodiment.

Referring to FIG. 4, a semiconductor light emitting device 10 according to an example embodiment may include a chip on board (COB)-type LED package. For example, the COB-type LED package may include a printed circuit board 1 and a semiconductor light emitting device 10 disposed on the printed circuit board 1. The printed circuit board 1 may include an insulating substrate, a circuit pattern formed on the insulating substrate, and the like, and the semiconductor light emitting device 10 may include a LED chip electrically connected to a circuit pattern of the printed circuit board 1. For example, the semiconductor light emitting device 10 shown in FIG. 4 may be the semiconductor light emitting device 10 shown in FIGS. 1 to 3.

Referring to FIGS. 4 and 5 together, the semiconductor light emitting device 10 may be disposed at predetermined intervals P on the printed circuit board 1. A luminance may have a maximum value at a position where the semiconductor light emitting devices 10 are disposed, and a luminance may have a minimum value at an intermediate position between the semiconductor light emitting devices 10.

In the COB-type LED package, luminance data according to the position shown in FIG. 5 may vary according to intervals P1 and P2 between the semiconductor light emitting devices 10. When the intervals P1 and P2 between the semiconductor light emitting devices 10 are fixed values, luminance at a plurality of positions may determine light uniformity and brightness of light emitted from the LED package. For example, as a difference between the maximum value and the minimum value of the detected luminance increases, a difference in brightness according to positions increases, so that the light uniformity may be lowered. The brightness of light emitted from the LED package may correspond to an average of luminance detected at a plurality of positions.

Referring to FIG. 5, luminance data according to positions in a LED package including a general semiconductor light emitting device may be shown as in Comparative Example 1. For example, the semiconductor diode package may include semiconductor light emitting devices arranged at an interval of P1 in order to maintain a predetermined degree of light uniformity.

Comparative Example 2 illustrated in FIG. 5 shows luminance data according to a position of a LED package including general semiconductor light emitting devices arranged at an interval of P2. As an interval between the semiconductor light emitting devices increases, a minimum value of luminance may decrease. For example, in the semiconductor light emitting devices included in Comparative Example 2, the minimum value of luminance may be decreased when compared to the semiconductor light emitting devices included in Comparative Example 1, and thus, light uniformity may be reduced.

Meanwhile, the semiconductor light emitting device 10 according to an example embodiment may increase an interval at which the semiconductor light emitting devices 10 are arranged to P2 while maintaining the light uniformity of the semiconductor diode package, by improving light radiation efficiency.

The semiconductor light emitting device 10 according to an example embodiment may improve light radiation efficiency, as compared to the semiconductor light emitting devices included in Comparative Examples 1 and 2, thereby increasing the minimum value of luminance while maintaining the maximum value of luminance. Accordingly, in the semiconductor light emitting device 10 according to an example embodiment, when the interval P2 between the semiconductor light emitting devices 10 is a fixed value, the light uniformity and brightness of the LED package can be improved. In addition, since the LED package including the semiconductor light emitting device 10 according to an example embodiment can maintain light uniformity even when the interval between the semiconductor light emitting devices 10 is increased, the number of semiconductor light emitting devices 10 may be reduced.

For example, P1 may be a value between about 8 mm and 10 mm, and P2 may have a value between about 11 mm and 13 mm. For example, the semiconductor light emitting device 10 according to an example embodiment may be disposed to be further spaced apart from the semiconductor light emitting device included in Comparative Examples 1 and 2 by about 20% to 30%.

Accordingly, the number of semiconductor light emitting devices 10 included in one LED package may be less than the number of semiconductor light emitting devices in Comparative Examples 1 and 2 included in one LED package. That is, by using the semiconductor light emitting device 10 according to an example embodiment, it is possible to increase a separation distance between the semiconductor light emitting devices 10 while maintaining brightness of a backlight unit, thereby reducing a production cost of the LED package.

Figure 6A:
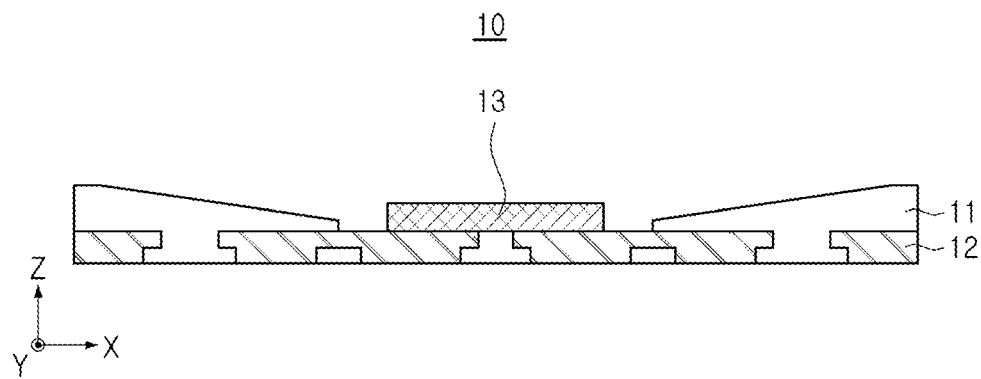
FIGS. 6A to 6C are views illustrating stages in a method of manufacturing a semiconductor light emitting device according to an example embodiment.
Figure 6B:
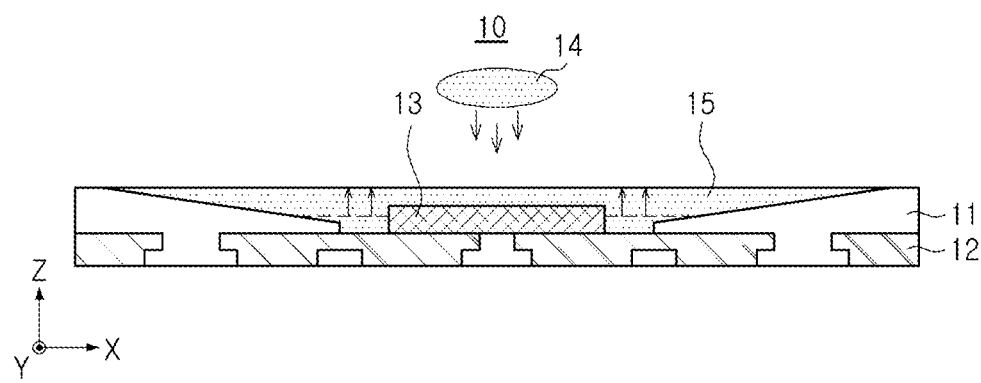
Figure 6C:
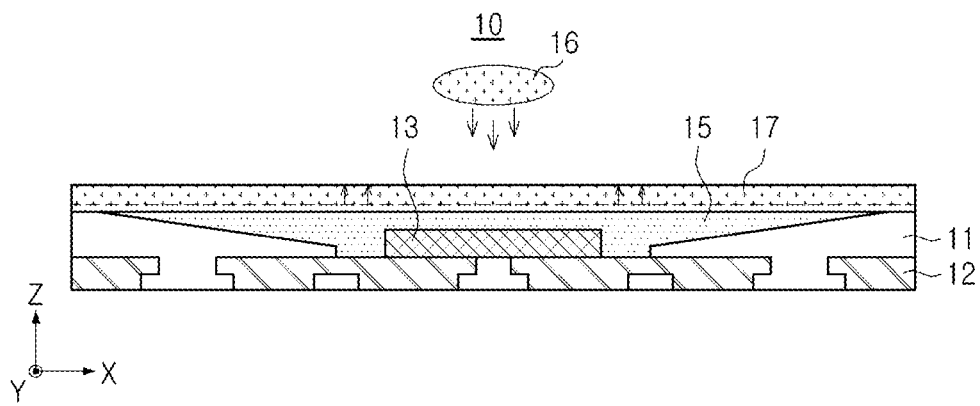

FIGS. 6A to 6C are views illustrating stages in a method of manufacturing a semiconductor light emitting device according to an example embodiment.

Referring to FIG. 6A, in the semiconductor light emitting device 10 according to an example embodiment, the lead frame 12 may be installed in the package body 11, which includes the concave portion C. For example, the package body 11 in which the lead frame 12 is installed may be defined as a frame.

A method of manufacturing the semiconductor light emitting device 10 according to an example embodiment may include an operation of forming a frame, and then plating a surface of the frame with metal, e.g., nickel (Ni), silver (Ag), or the like. Meanwhile, the semiconductor light emitting device 10 may be a sawing-type light emitting device package. The frame can be separated into individual frames by a sawing process. For example, a side surface of the package body 11 may be coplanar with a side surface of the lead frame 12. Accordingly, a portion of the lead frame 12 including a copper (Cu) alloy may be directly exposed without plating at a boundary with other semiconductor light emitting devices.

The LED chip 13 may be disposed so that a lower surface thereof faces a bottom surface, e.g., the mounting surface, of the concave portion C, e.g., the LED chip 13 may be positioned on the mounting surface of the concave portion C. Although not shown in FIGS. 6A to 6C, the LED chip 13 may be connected to an electrode using a conductive bump, e.g., a solder ball, and further may be electrically connected to the lead frame 12.

Referring to FIG. 6B, the method of manufacturing the semiconductor light emitting device 10 according to an example embodiment may include an operation of loading uncured first resin 14 to an upper surface of the LED chip 13. For example, the first resin 14 may include a KSF phosphor. The first resin 14 may flow down along a side surface of the LED chip 13 to fill the concave portion C while surrounding the LED chip 13.

After loading the first resin 14 in a predetermined amount, the first resin 14 may be cured to form the first layer 15. The first layer 15 may include a side surface inclined at a predetermined angle along the inclined surface of the concave portion C.

Referring to FIG. 6C, after the first layer 15 is formed, an uncured second resin 16 may be loaded to an upper surface of the first layer 15. The second resin 16 may be a resin including silicone. However, this is merely an example and the present disclosure is not limited thereto, e.g., the second resin 16 may be a resin further including a phosphor and/or a dispersant together with silicone.

After dropping the second resin 16 by a predetermined amount, e.g., a sufficient amount may be disposed to completely cover the first layer 15 to a predetermined height (e.g., H3 described previously), the second resin 16 may be cured to form the second layer 17, similarly to the first resin 14. The second layer 17 may seal the first layer 15 so that it is not exposed externally.

In the method of FIGS. 6A and 6C, the semiconductor light emitting device 10 according to an example embodiment, the first layer 15 and the second layer 17 may be formed through separate processes. However, the first layer 15 and the second layer 17 may be formed through a single process.

Figure 7A:
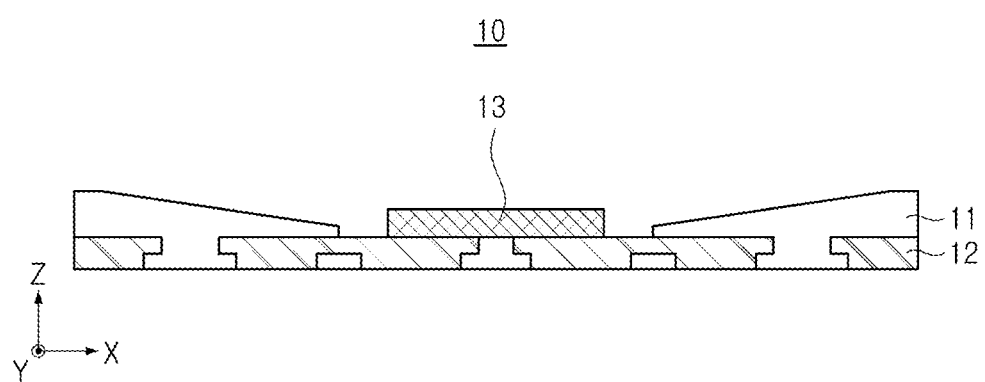
FIGS. 7A to 7C are views illustrating stages in a method of manufacturing a semiconductor light emitting device according to an example embodiment.
Figure 7B:
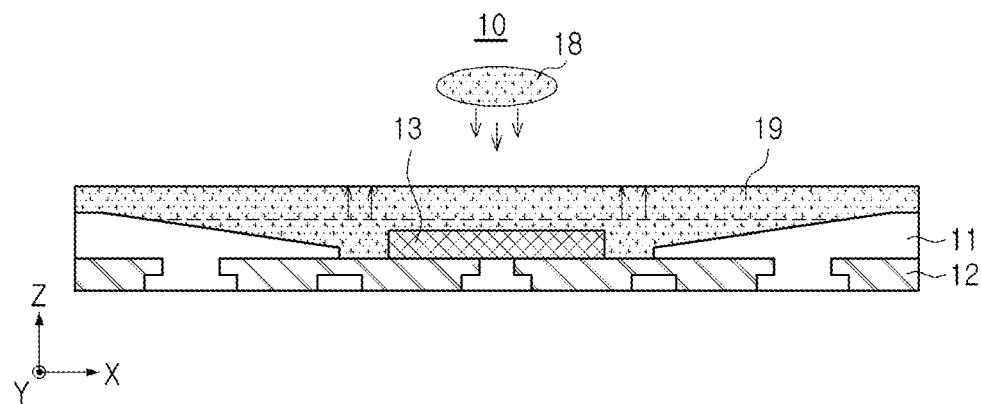
Figure 7C:
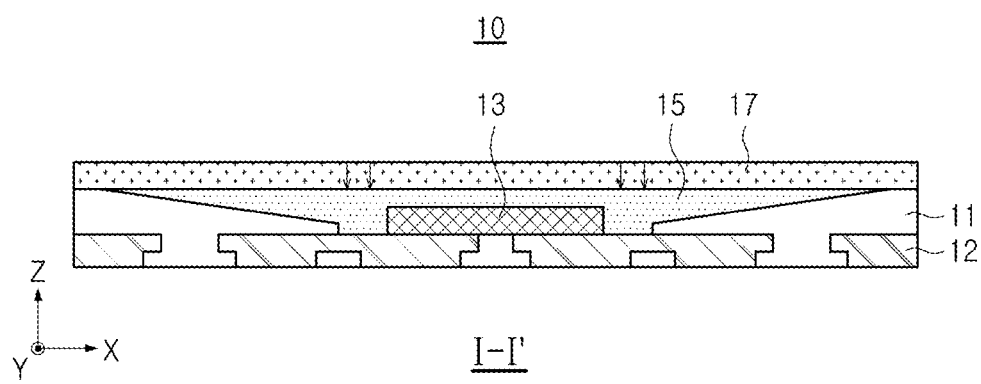

FIGS. 7A to 7C are views illustrating stages in a method of manufacturing a semiconductor light emitting device according to another example embodiment.

FIGS. 7A to 7C may correspond to the manufacturing method of FIGS. 6A to 6C. For example, a semiconductor light emitting device 10 manufactured through the manufacturing method of FIGS. 7A to 7C may have a structure similar to that of the semiconductor light emitting device 10 manufactured through the manufacturing method of FIGS. 6A to 6C. However, unlike the manufacturing method of the semiconductor light emitting device 10 shown in FIGS. 6A to 6C, referring to FIGS. 7A to 7C, in the semiconductor light emitting device 10 according to an example embodiment, the first layer 15 and the second layer 17 may be formed in one non-separated operation.

Referring to FIG. 7A, the structure of the lead frame 12, the package body 11, and the LED chip 13 may be formed, as discussed previously with reference to FIG. 6A. As illustrated in FIG. 7A, a maximum thickness (at the periphery) of the package body 11 in the first direction may be larger than a thickness of the LED chip 13.

Referring to FIG. 7B, an uncured third resin 18 may be dropped on an upper surface of the LED chip 13. For example, the third resin 18 may include a KSF phosphor having a predetermined ratio and silicone. The third resin 18 may flow down along a side surface of the LED chip 13 to fill the concave portion C while surrounding the LED chip 13, and may be disposed on the package body 11 in the second direction.

Referring to FIG. 7C, a KSF phosphor may be precipitated before the third resin 18 is cured. For example, the precipitated KSF phosphor may be cured to form the first layer 15, and silicone positioned above the deposited, e.g., precipitated, KSF phosphor may be cured to form the second layer 17. For example, the first layer 15 may include a cured KSF phosphor precipitant, and the second layer 17 may include the silicone remaining above the precipitant. As in FIG. 6C, the first layer 15 may include an inclined surface inclined at a predetermined angle along an inclined surface of the concave portion C, and the second layer 17 may be sealed such that the first layer 15 is not exposed externally.

Figure 8:
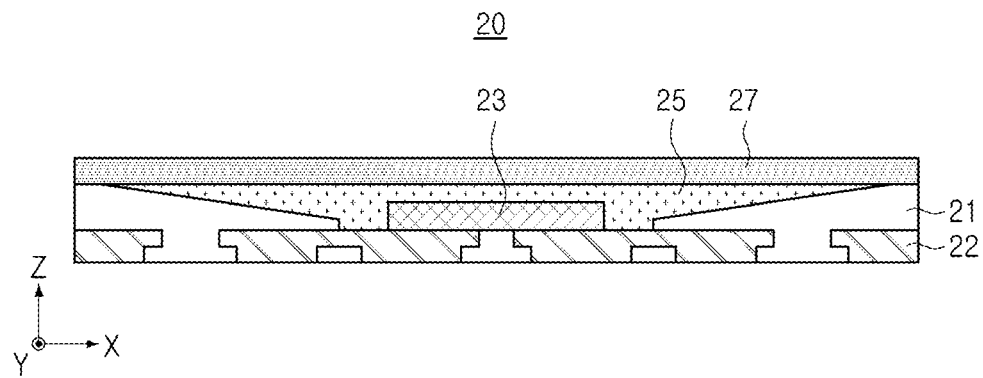
FIGS. 8 and 9 are cross-sectional views illustrating a semiconductor light emitting device according to an example embodiment.
Figure 9:
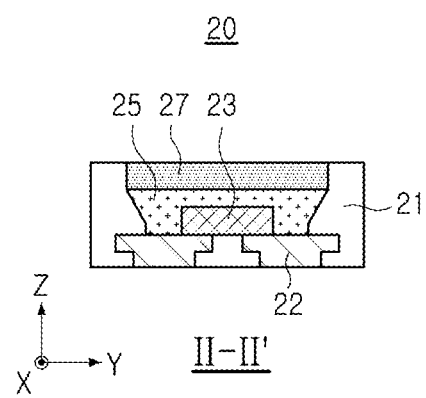

FIGS. 8 and 9 are cross-sectional views illustrating a semiconductor light emitting device according to an example embodiment.

Referring to FIGS. 8 and 9, a semiconductor light emitting device 20 according to an example embodiment may correspond to the semiconductor light emitting device 10 illustrated in FIGS. 2 and 3. For example, the semiconductor light emitting device 20 may have the same structure as the semiconductor light emitting device 10 except for a configuration of a first layer 25 and a second layer 27. The semiconductor light emitting device 20 may be configured to include a package body 21, a lead frame 22, a LED chip 23, the first layer 25, and the second layer 27.

However, unlike the semiconductor light emitting device 10, the first layer 25 included in the semiconductor light emitting device 20 may be a transparent resin layer including silicone, and the second layer 27 may be a wavelength conversion layer including a phosphor. For example, the first layer 25 of the semiconductor light emitting device 20 may correspond to the second layer 17 of the semiconductor light emitting device 10 illustrated in FIG. 2. However, unlike the first layer 15 of the semiconductor light emitting device 10 shown in FIG. 2, the second layer 27 of the semiconductor light emitting device 20 may include a wavelength conversion material other than a KSF phosphor.

The wavelength conversion material included in the second layer 27 of the semiconductor light emitting device 20 according to an example embodiment may have relatively low sensitivity to temperature and/or humidity compared to the KSF phosphor. Accordingly, even if there is no barrier, e.g., a silicone layer on the second layer 27, reliability of the semiconductor light emitting device 20 may be secured. Meanwhile, like the semiconductor light emitting device 10 shown in FIG. 2, the semiconductor light emitting device 20 may improve light radiation efficiency by using its structural features.

Figure 10:
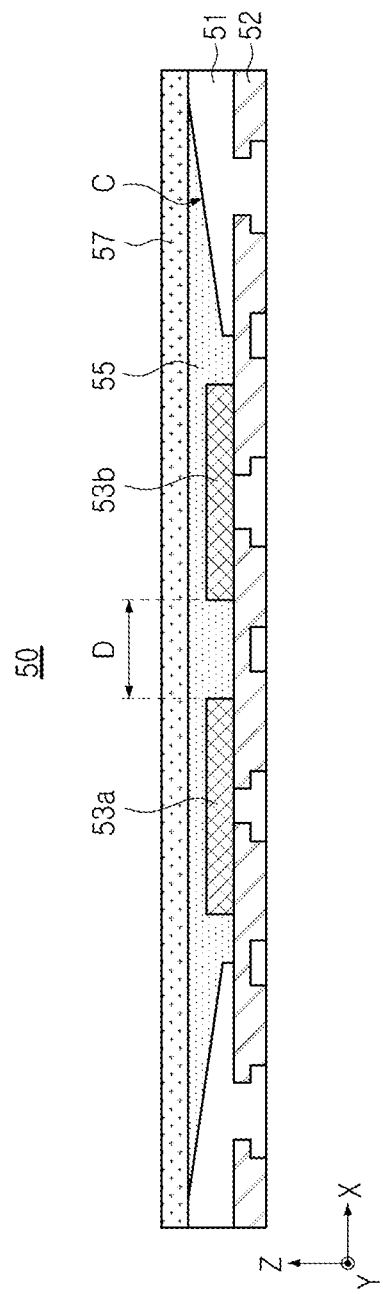
FIG. 10 is a cross-sectional view of a semiconductor light emitting device according to an example embodiment.

FIG. 10 is a schematic cross-sectional view of a semiconductor light emitting device according to an example embodiment.

Referring to FIG. 10, a semiconductor light emitting device 50 according to an example embodiment may correspond to the semiconductor light emitting device 10 illustrated in FIGS. 1 to 3. For example, the semiconductor light emitting device 50 may include a package body 51, a lead frame 52, a first layer 55 including a wavelength conversion material, and a second layer 57 including silicone.

Meanwhile, the semiconductor light emitting device 50 may include a plurality of LED chips 53a and 53b spaced apart from each other in the concave portion C. For example, the plurality of LED chips 53a and 53b may be disposed to be spaced apart from each other by a predetermined distance D in one direction in which one side surfaces of the second layer 57 are located. For example, the plurality of LED chips 53a and 53b may be spaced apart by a distance between about 2.7 mm and 3.4 mm.

Although the semiconductor light emitting device 50 illustrated in FIG. 10 is illustrated in which two LED chips 53a and 53b are disposed, this is merely an example and is not limited thereto. For example, a plurality of LED chips 53a and 53b may be disposed in one concave portion of the semiconductor light emitting device 50.

Figure 11:
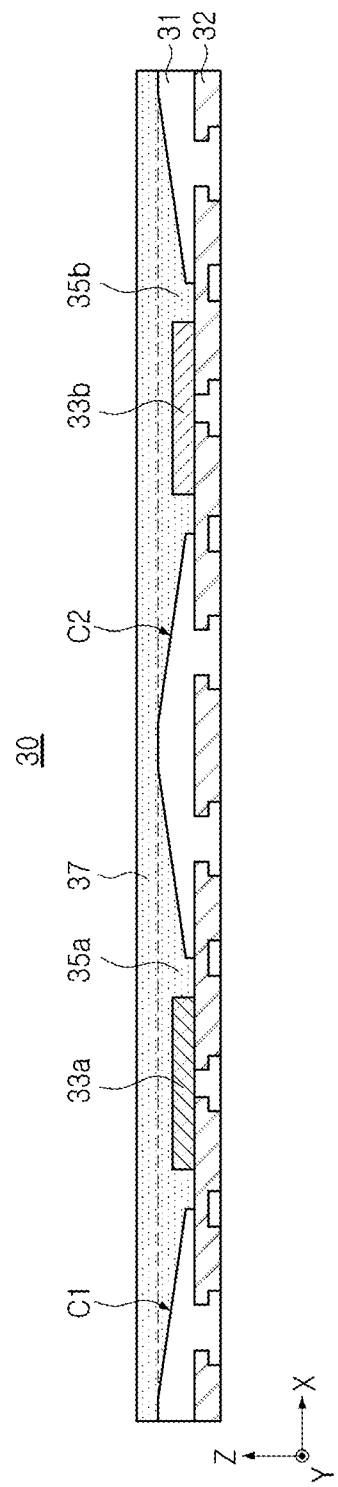
FIGS. 11 and 12 are respectively an upper view and a cross-sectional view of a semiconductor light emitting device according to an example embodiment.
Figure 12:
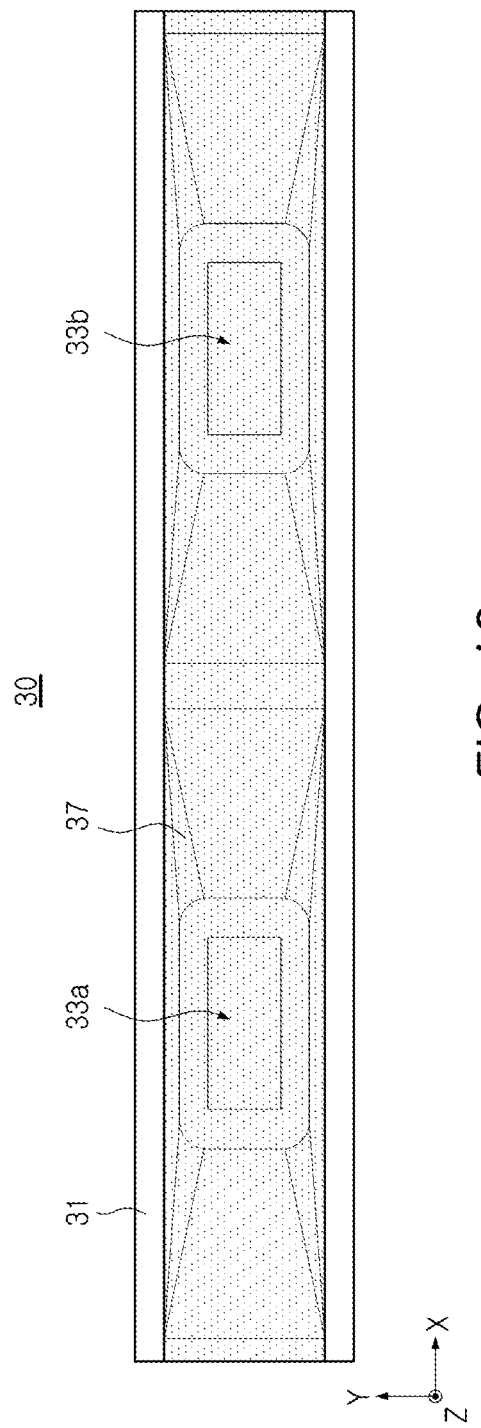

FIGS. 11 and 12 are a cross-sectional view and an upper view, respectively, of a semiconductor light emitting device according to an example embodiment.

Referring to FIGS. 11 and 12, a semiconductor light emitting device 30 according to an example embodiment may be a LED package including two LED chips 33a and 33b. For example, the semiconductor light emitting device 30 may include a package body 31, a lead frame 32, a first LED chip 33a, a second LED chip 33b, first layers 35a and 35b, and a second layer 37. Each of the components may correspond to components included in the semiconductor light emitting device 10 illustrated in FIGS. 1 to 3.

In the semiconductor light emitting device 30 according to an example embodiment, the package body 31 may include a first concave portion C1 and a second concave portion C2 defined by a sidewall. For example, the first concave portion C1 and the second concave portion C2 may be disposed side by side in the second direction, perpendicular to the first direction. Each of the first concave portion C1 and the second concave portion C2 may be surrounded by a sidewall.

The first LED chip 33a may be disposed in the first concave portion C1, and the second LED chip 33b may be disposed in the second concave portion C2. The lead frame 32 may be exposed to the first concave portion C1 and the second concave portion C2 of the package body 31 to electrically connect a printed circuit board to the LED chips 33a and 33b.

The semiconductor light emitting device 30 according to an example embodiment may include first layers 35a and 35b including a phosphor, and the second layer 37. For example, the first layers 35a and 35b may include a first region 35a disposed in the first concave portion C1 and surrounding the first LED chip 33a and a second region 35b disposed in the second concave portion C2 and surrounding the second LED chip 33b. For example, in an outer boundary region of the concave portions C1 and C2, a height of the first layers 35a and 35b may be less than or equal to a height of the first and second concave portions C1 and C2. The second layer 37 may be disposed on the first layers 35a and 35b.

The semiconductor light emitting device 30 according to an example embodiment may improve light radiation efficiency by using the structure of the second layer 37 radiating light in three directions, and the first concave portion C1 and the second concave portion C2 that include an inclined surface at a predetermined angle.

Figure 13:
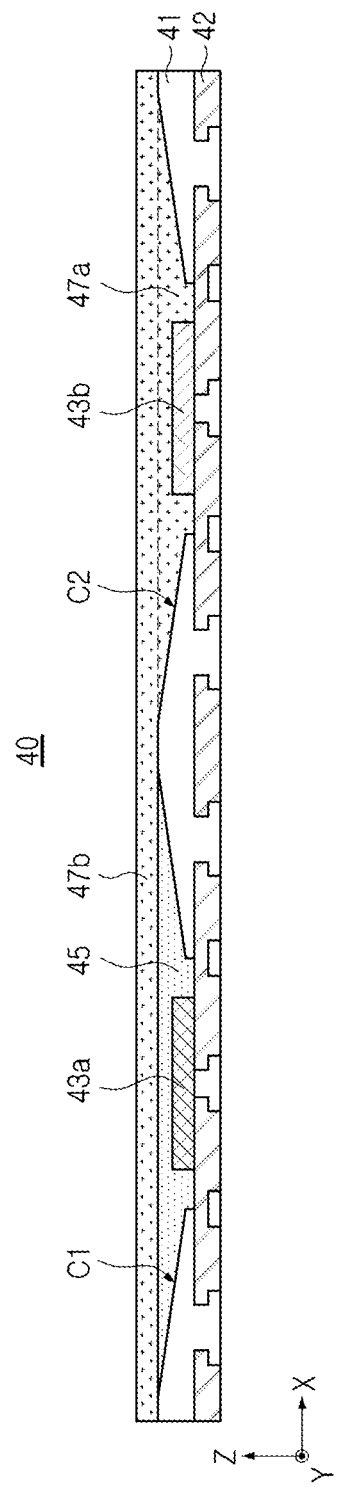
FIGS. 13 and 14 are respectively an upper view and a cross-sectional view of a semiconductor light emitting device according to an example embodiment.
Figure 14:
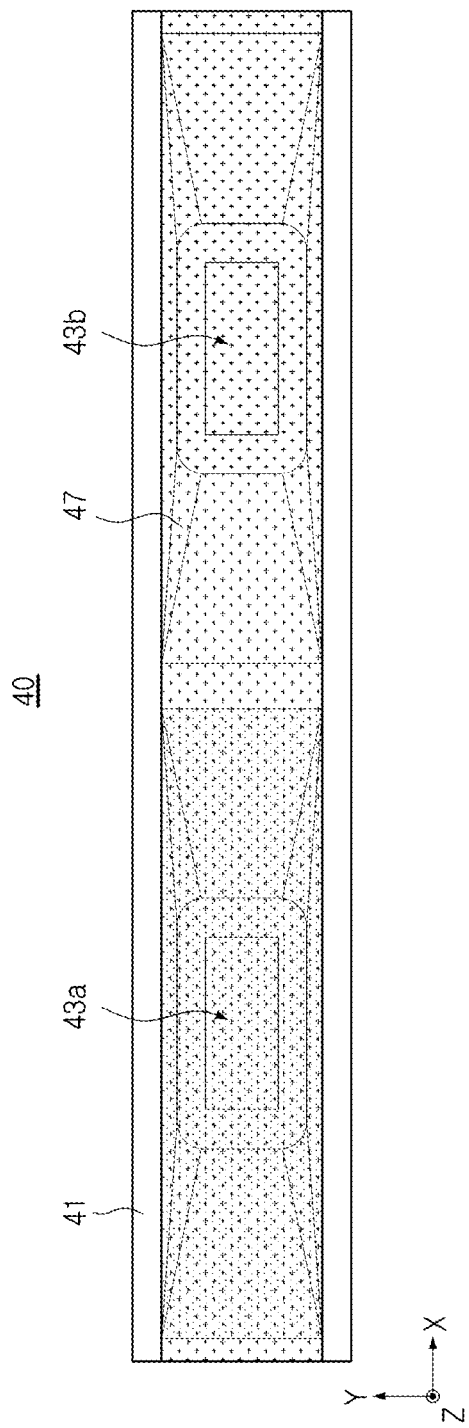

FIGS. 13 and 14 are a cross-sectional view and an upper view, respectively, of a semiconductor light emitting device according to an example embodiment.

A semiconductor light emitting device 40 shown in FIGS. 13 and 14 may correspond to the semiconductor light emitting device 30 described with reference to FIGS. 11 and 12. For example, the semiconductor light emitting device 40 may have the same structure as the semiconductor light emitting device 30 except for a configuration of first layers 45 and 47a and a second layer 47b. The semiconductor light emitting device 40 may be configured to include a package body 41, a lead frame 42, a first LED chip 43a, a second LED chip 43b, first layers 45 and 47a, and a second layer 47b.

Referring to FIG. 13, the first layers 45 and 47a included in the semiconductor light emitting device 40 may include a first region 45 disposed in a first concave portion C1 and a second region 47a disposed in a second concave portion C2. For example, the first region 45 may be a wavelength conversion layer surrounding a first LED chip 43a and including a wavelength conversion material, and the second region 47a may be a transparent resin layer surrounding a second LED chip 43b and including silicone.

The second layer 47b may include a first upper layer having one side surface of the package body 41 open in a long axial direction on the wavelength conversion layer 45 and a second upper layer having the other side surface of the package body 41 open in a long axial direction on the transparent resin layer. The second layer 47b may be disposed on a side surface of the package body 41 in a short axial direction of the package body 41. In the semiconductor light emitting device 40 shown in FIG. 13, the first upper layer and the second upper layer may include one resin layer connected on a partition wall.

In other words, the first region 45 of the first layers 45 and 47a included in the semiconductor light emitting device 40 according to an example embodiment may include a KSF phosphor, and the second region 47a of the first layers 45 and 47a and the second layer 47b may include silicone. Accordingly, the semiconductor light emitting device 40 may improve light radiation efficiency by using the structure according to an example embodiment, while protecting the first layer 45 using the second layer 47b.

Figure 15:
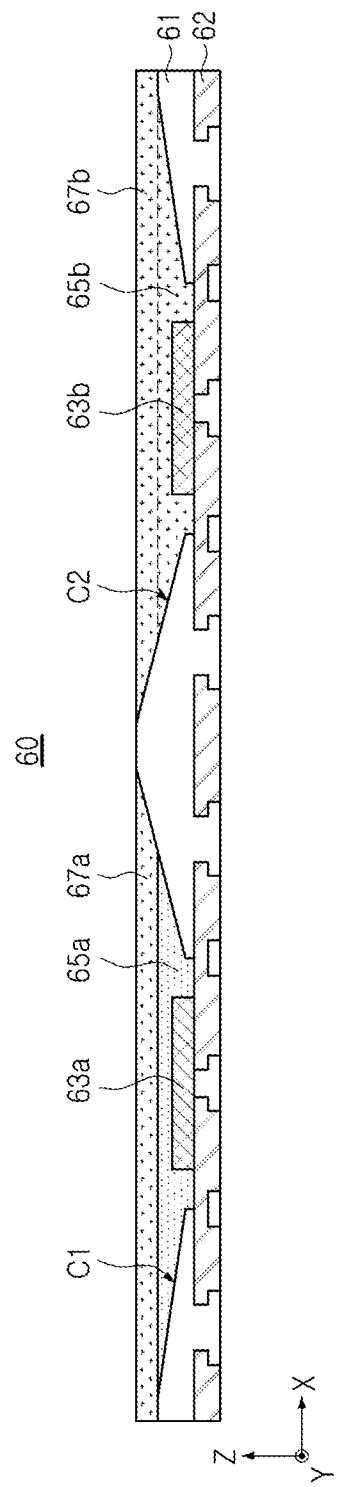
FIG. 15 is a schematic cross-sectional view of a semiconductor light emitting device according to an example embodiment.

FIG. 15 is a schematic cross-sectional view of a semiconductor light emitting device according to an example embodiment.

A semiconductor light emitting device 60 shown in FIG. 15 may correspond to the semiconductor light emitting device 40 described with reference to FIGS. 13 and 14. For example, the semiconductor light emitting device 60 may include a package body 61, a lead frame 62, a first LED chip 63a, a second LED chip 63b, and first layers 65a and 65b. However, unlike the semiconductor light emitting device 40 illustrated in FIGS. 13 and 14, the semiconductor light emitting device 60 may include a first upper layer 67a and a second upper layer 67b separated from each other.

The first layers 65a and 65b may include a first region 65a disposed in a first concave portion C1 and a second region 65b disposed in a second concave portion C2. Meanwhile, the second layers 67a and 67b may include a first upper layer 67a disposed on the first region 65a and a second upper layer 67b disposed on the second region 65b.

The first concave portion C1 and the second concave portion C2 may be defined by an inclined surface formed in the package body 61. Accordingly, a partition wall having an inclined surface may be formed between the first concave portion C1 and the second concave portion C2.

In the semiconductor light emitting device 60 according to an example embodiment, the first upper layer 67a and the second upper layer 67b may be physically separated, e.g., divided, by a partition wall. For example, the first layers 65a and 65b may be formed to be lower than the partition walls in the first direction (e.g., a Z direction).

For example, the first region 65a disposed in the first concave portion C1 and the first upper layer 67a disposed on the first region 65a may include a wavelength conversion material, and the second region 65b disposed in the second concave portion C1 and the second upper layer 67b disposed on the second region 65b may include silicone. For example, the semiconductor light emitting device may be configured to have a structure similar to that of the semiconductor light emitting device 60 shown in FIG. 15 and include various materials as needed.

Figure 16:
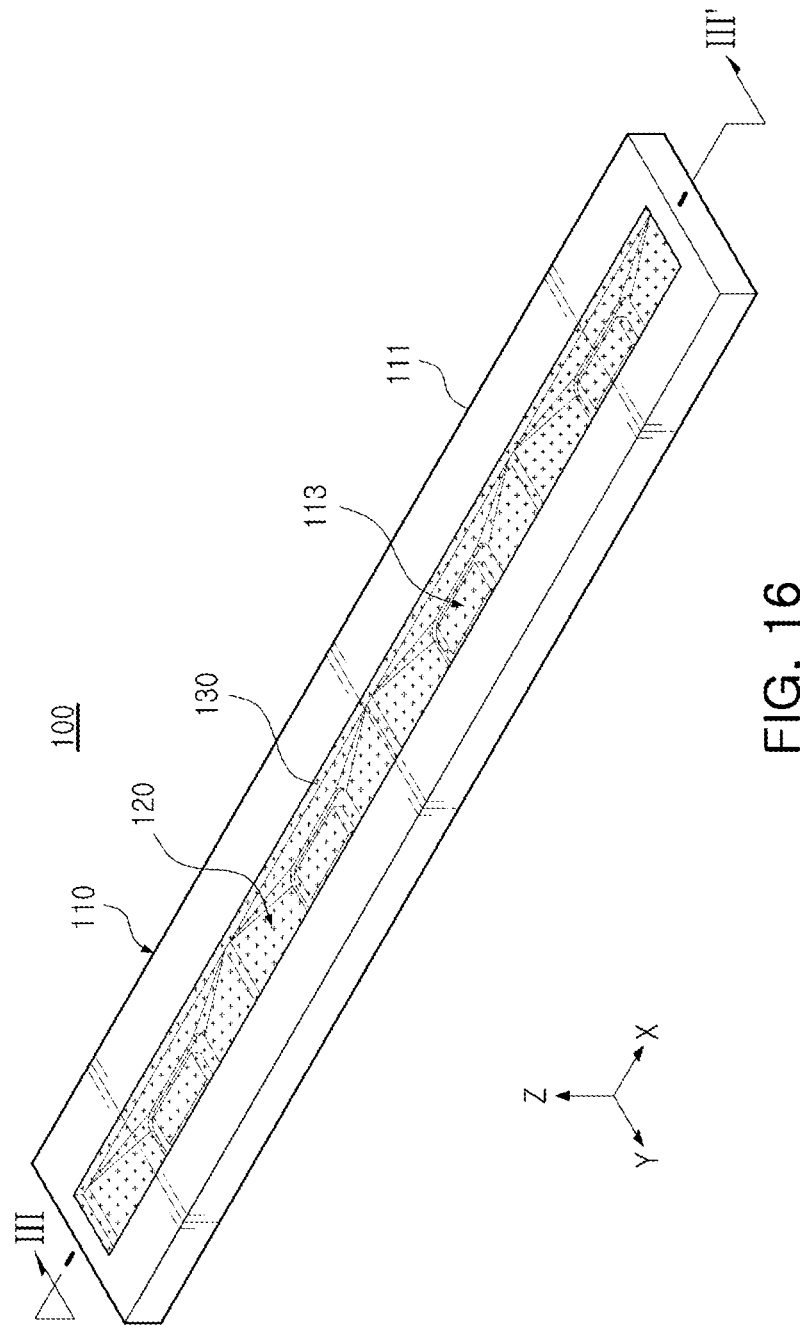
FIG. 16 is a perspective view illustrating a semiconductor light emitting device array according to an example embodiment.
Figure 17:
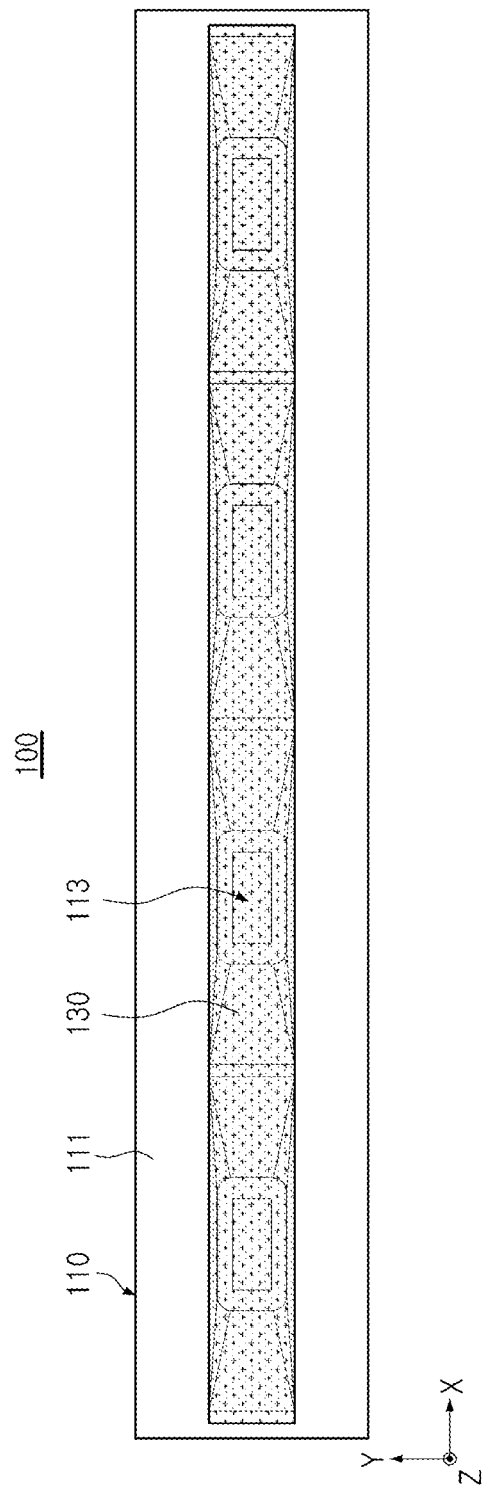
FIGS. 17 and 18 are respectively an upper view and a cross-sectional view of a semiconductor light emitting device array according to an example embodiment.
Figure 18:
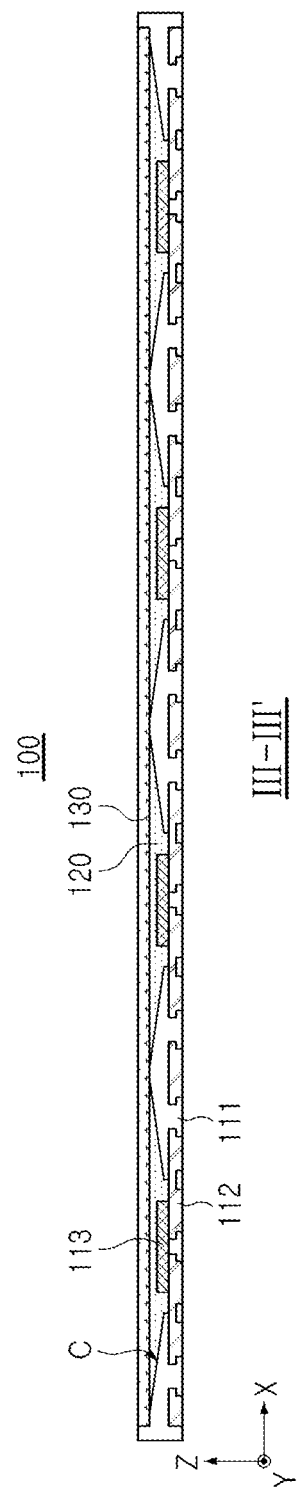

FIG. 16 is a perspective view illustrating a semiconductor light emitting device array according to an example embodiment. FIGS. 17 and 18 are respectively an upper view and a cross-sectional view of a semiconductor light emitting device array according to an example embodiment.

FIGS. 16 to 18 are views illustrating a semiconductor light emitting device array 100 including a plurality of the semiconductor light emitting devices 10 according to an example embodiment. In particular, FIG. 18 is a cross-sectional view in a long axial direction of the semiconductor light emitting device array 100 taken along line III-III' of FIG. 16.

Referring to FIGS. 16 to 18, the semiconductor light emitting device array 100 may include an array body 110, a first layer 120, and a second layer 130.

The array body 110 may include a package body 111 including a plurality of concave portions C in which a plurality of LED chips 113 are respectively disposed, and a lead frame 112 electrically connected to the plurality of LED chips 113. The plurality of LED chips 113 may have an upper surface, perpendicular to a first direction. The plurality of concave portions C may be disposed side by side in a second direction, and may be surrounded by sidewalls including an inclination having a predetermined angle, respectively.

The first layer 120 may be disposed to surround the plurality of LED chips 113 while filling an inside of each of the plurality of concave portions C. A height of the first layer 120 in the first direction may be less than or equal to a height of the plurality of concave portions C. For example, the first layer 120 may be a layer including a phosphor.

The second layer 130 may be disposed on the first layer 120 so that the first layer 120 is not directly exposed externally. The second layer 130 may extend on the first layer 120 corresponding to each of the plurality of concave portions C in the second direction. For example, the second layer 130 may be a transparent layer including silicone.

In the semiconductor light emitting device array 100 according to an example embodiment, the package body 111 disposed between the plurality of LED chips 113 may be formed to a lower height than the array body 110 in the first direction. For example, the second layer 130 may be disposed above the package body 111. A structure of the second layer 130 and an inclined structure of the concave portion C may serve to improve a radiation efficiency of light emitted from the plurality of LED chips 113 externally.

The semiconductor light emitting device array 100 illustrated in FIGS. 16 to 18 has been described as an example in which four LED chips 113 are provided, but is not limited thereto. For example, the number of LED chips 113 may be appropriately selected according to a power source of a lighting device or the like, in which the semiconductor light emitting device array 100 is used.

Figure 19:
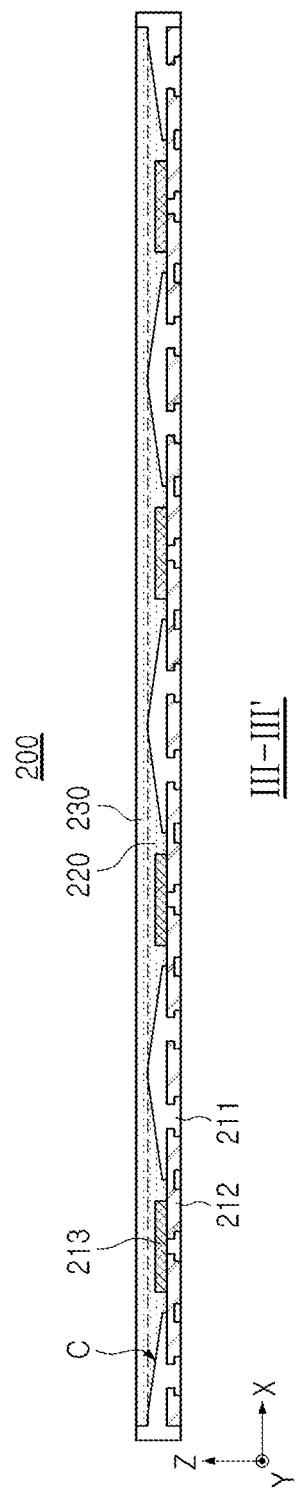
FIG. 19 is a cross-sectional view illustrating a semiconductor light emitting device array according to an example embodiment.

FIG. 19 is a cross-sectional view illustrating a semiconductor light emitting device array according to an example embodiment.

Referring to FIG. 19, a semiconductor light emitting device array 200 according to an example embodiment may correspond to the semiconductor light emitting device array 100 shown in FIG. 18. For example, the semiconductor light emitting device array 200 may have the same structure as the semiconductor light emitting device array 100 except for a configuration of a second layer 230. The semiconductor light emitting device array 200 may be configured to include an array body including a package body 211 and a lead frame 212, a first layer 220, and a second layer 230.

However, unlike the semiconductor light emitting device array 100, the second layer 230 included in the semiconductor light emitting device array 200 may be a layer including a phosphor. That is, in the semiconductor light emitting device array 200, both the first layer 220 and the second layer 230 may include a phosphor. For example, the phosphor included in the first layer 220 and the second layer 230 may be a KSF phosphor. However, this is merely an example and the present disclosure is not limited thereto, and phosphors other than KSF phosphors may be included in the first layer 220 and the second layer 230, and different types of phosphors from each other may be included in the first layer 220 and the second layer 230.

Figure 20:
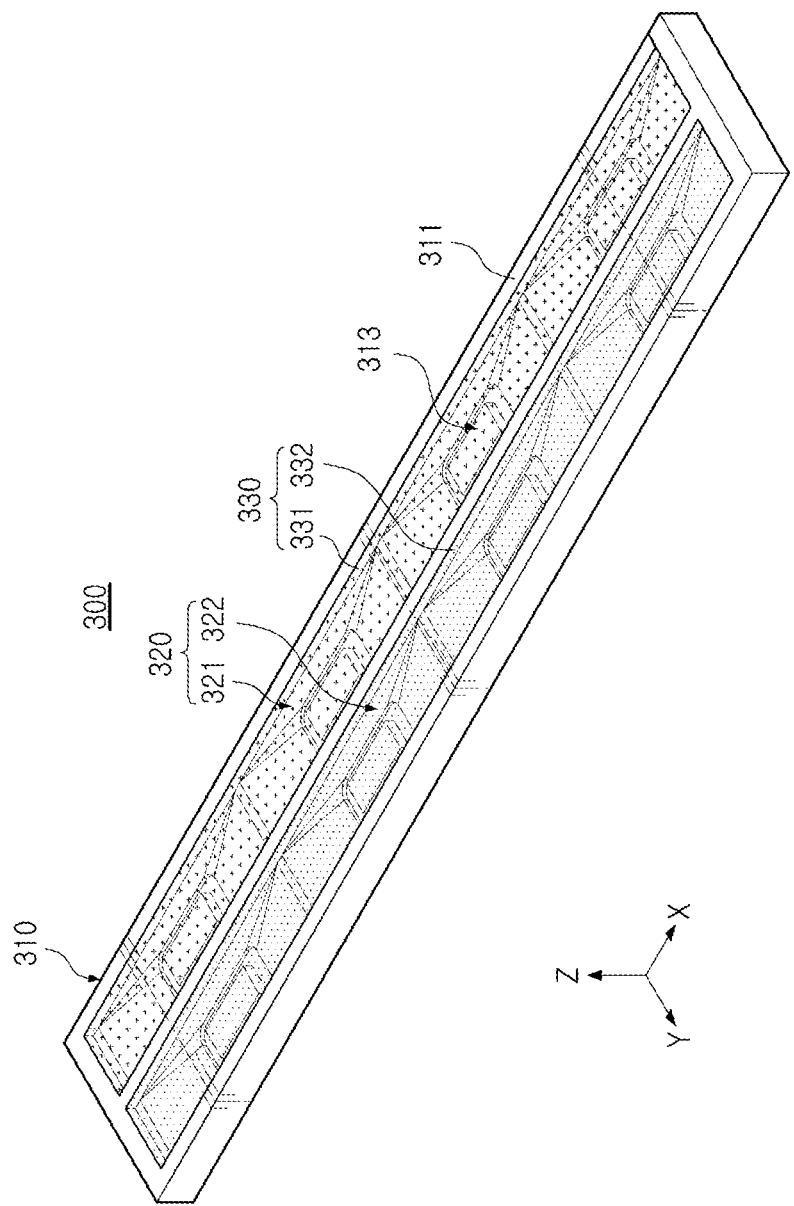
FIG. 20 is a perspective view illustrating a semiconductor light emitting device array according to an example embodiment.

FIG. 20 is a perspective view illustrating a semiconductor light emitting device array according to an example embodiment.

Referring to FIG. 20, a semiconductor light emitting device array 300 according to an example embodiment may correspond to the semiconductor light emitting device array 100 shown in FIG. 16. However, compared to the semiconductor light emitting device array 100, a plurality of LED chips 313 included in the semiconductor light emitting device array 300 may be disposed not only in the second direction but also in the third direction. For example, in the third direction, the plurality of LED chips 313 may be separated by a package body 311.

The package body 311 may include a plurality of concave portions corresponding to each of the plurality of LED chips 313. That is, the plurality of concave portions may be disposed side by side in the second direction and the third direction. Meanwhile, the plurality of concave portions disposed side by side in the third direction may be separated by the package body 311.

The semiconductor light emitting device array 300 according to an example embodiment may include a first array and a second array separated by the package body 311 in the third direction. A first layer 321 and a second layer 331 may be disposed in the plurality of concave portions included in the first array, and a third layer, different from the first layer 321 and the second layer 331 may be disposed in the plurality of concave portions included in the second array.

The third layer of the second array may have a structure in which the first layer 322 and the second layer 332 are stacked similarly to the first array. The first layer 321 of the first array and the first layer 322 of the second array may be disposed in the plurality of concave portions to surround a plurality of LED chips 313. The second layer 331 of the first array and the second layer 332 of the second array may be disposed on the first layer 321 of the first array and the first layer 322 of the second array, respectively. For example, the second layer 330 may be sealed so that the first layer 320 is not directly exposed externally.

Meanwhile, the first layer 321 and the second layer 331 of the first array may include silicone, and the first layer 322 and the second layer 332 of the second array may include a phosphor. For example, the first layer 322 of the second array may include a phosphor and the second layer 332 may include silicone. In addition, they may include a phosphor and silicone in which each of the first layer 322 and the second layer 332 of the second array are mixed at a predetermined ratio.

By way of summation and review, among phosphors used in semiconductor light emitting devices, KSF phosphors are cheaper than other phosphors. However, the KSF phosphors are sensitive to moisture and thus have poor reliability.

In contrast, an aspect of embodiments is to provide a semiconductor light emitting device having improved image quality and brightness by having a three-sided light emitting structure and a transparent silicone layer as a barrier over a KSF phosphor, thereby protecting the phosphor from moisture and improving image quality. That is, as set forth above, according to an example embodiment, a semiconductor light emitting device may include a sealed wavelength conversion layer emitting light through one surface, and a transparent resin layer emitting light disposed on the wavelength conversion layer and emitting light through three surfaces. Accordingly, a reliability problem of the phosphor included in the semiconductor light emitting device can be improved, and a light directivity angle can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a package body including a concave portion, the concave portion being surrounded by sidewalls of the package body;
at least one light emitting diode (LED) chip on a mounting surface of the concave portion;
a lead frame in the package body, the lead frame being electrically connected to the at least one LED chip;
a wavelength conversion layer in the concave portion and surrounding the at least one LED chip, the wavelength conversion layer being surrounded by the sidewalls of the package body and including a wavelength conversion material; and
a transparent resin layer on the wavelength conversion layer to seal the wavelength conversion layer, the transparent resin layer having:
first opposite side surfaces exposed through sides of the package body, the first opposite side surfaces being spaced apart from each other along a first direction parallel to the mounting surface, and
second opposite side surfaces in contact with an inner surface of the package body, the second opposite side surfaces being spaced apart from each other in a second direction parallel to the mounting surface.

2. The semiconductor light emitting device as claimed in claim 1, wherein the wavelength conversion layer includes a precipitant of a resin on an upper surface of the at least one LED chip, and the transparent resin layer includes a remaining portion of the resin.

3. The semiconductor light emitting device as claimed in claim 1, wherein the wavelength conversion material includes $K_xSiF_y:Mn^{4+}$ ($2 \leq x \leq 3$, $4 \leq y \leq 7$).

4. The semiconductor light emitting device as claimed in claim 1, wherein the transparent resin layer includes at least one of a phosphor and a dispersant.

5. The semiconductor light emitting device as claimed in claim 1, wherein a first length of the transparent resin layer between the first opposite side surfaces in the first direction is greater than a second length of the transparent resin layer between the second opposite side surfaces in the second direction.

6. The semiconductor light emitting device as claimed in claim 1, wherein the first opposite side surfaces of the transparent resin layer are coplanar with respective side surfaces of the package body and respective side surfaces of the lead frame, the respective side surfaces of the lead frame being directly exposed.

7. The semiconductor light emitting device as claimed in claim 1, wherein a sidewall of the concave portion in the first direction is inclined at an angle between 120° and 170° with respect to an upper surface of the at least one LED chip.

8. The semiconductor light emitting device as claimed in claim 1, wherein a height of the transparent resin layer in an outer boundary portion of the concave portion is between 30% and 70% of a sum of heights of the wavelength conversion layer and the transparent resin layer.

9. The semiconductor light emitting device as claimed in claim 1, wherein a height of the transparent resin layer is between 170 μm and 330 μm in an outer boundary portion of the concave portion.

10. The semiconductor light emitting device as claimed in claim 1, wherein the at least one LED chip includes a plurality of LED chips spaced apart from each other by a predetermined distance in the first direction.

11. The semiconductor light emitting device as claimed in claim 10, wherein the predetermined distance is between 2.7 mm and 3.4 mm.

12. A semiconductor light emitting device, comprising:
a package body including a concave portion, the concave portion being surrounded by sidewalls of the package body, and the concave portion including a first concave portion and a second concave portion, divided by a partition wall and disposed side by side in a long axial direction;
a first light emitting diode (LED) chip on a mounting surface of the first concave portion;
a second LED chip on a mounting surface of the second concave portion;
a lead frame in the package body, the lead frame being electrically connected to the first LED chip and the second LED chip;
a wavelength conversion layer in the first concave portion and surrounding the first LED chip, the wavelength conversion layer including a wavelength conversion material;
a transparent resin layer in the second concave portion and surrounding the second LED chip;
a first upper layer on the wavelength conversion layer, the first upper layer having first opposite side surfaces spaced apart from each other in the long axial direction of the package body, and one surface of the first opposite side surfaces being exposed through the package body; and a second upper layer on the transparent resin layer, the second upper layer having second opposite side surfaces spaced apart from each other in the long axial direction of the package body, and one surface of the second opposite side surfaces being exposed through the package body, wherein the first upper layer and the second upper layer being in contact with a side surface of the package body in a short axial direction of the package body.

13. The semiconductor light emitting device as claimed in claim 12, wherein the first upper layer and the second upper layer are physically separated by the partition wall, the first upper layer including a wavelength conversion material constituting the wavelength conversion layer, and the second upper layer including silicone constituting the transparent resin layer.

14. The semiconductor light emitting device as claimed in claim 13, wherein a height of each of the wavelength conversion layer and the transparent resin layer is smaller than a height of the partition wall.

15. The semiconductor light emitting device as claimed in claim 12, wherein the first upper layer and the second upper layer include one resin layer connected to each other on the partition wall, the one resin layer including silicone constituting the transparent resin layer.

16. A semiconductor light emitting device array, comprising:

an array body including a package body with concave portions arranged side by side in a first direction, each of the concave portions being surrounded by a sidewall;

a light emitting diode (LED) chip on a mounting surface in each of the concave portions, a lead frame being electrically connected to the LED chip;

a wavelength conversion layer in each of the concave portions and surrounding the LED chip, the wavelength conversion layer including a wavelength conversion material that is a precipitant of a resin applied to an upper surface of the LED chip; and a transparent resin layer on the wavelength conversion layer to seal the wavelength conversion layer, the transparent resin layer extending in the first direction, and including a remaining portion of the resin.

17. The semiconductor light emitting device array as claimed in claim 16, wherein the wavelength conversion layer is surrounded by a side surface of the package body in each of the concave portions, and the transparent resin layer is surrounded by the side surface of the package body on the wavelength conversion layer.

18. The semiconductor light emitting device array as claimed in claim 16, wherein a distance between LED chips respectively disposed in the concave portions is between 11 mm and 13 mm.

19. The semiconductor light emitting device array as claimed in claim 16, wherein the package body further includes additional concave portions, the additional concave portions being separated from the concave portions by the package body in a second direction perpendicular to the first direction.

20. The semiconductor light emitting device array as claimed in claim 19, wherein layers in the concave portions and the additional concave portions are disposed in different configurations from each other.

* * * * *